United States Patent [19]

Skold et al.

[11] Patent Number: 5,477,055

[45] Date of Patent: Dec. 19, 1995

[54] METHOD OF PRODUCING GEMSTONE QUALITY TOPAZ

[75] Inventors: Kurt Skold, Nyköping, Sweden; Erik Svendsen, Vancouver, Canada; William Yelon, Columbia, Mo.

[73] Assignee: Ostro Gems, Thailand

[21] Appl. No.: 304,503

[22] Filed: Sep. 12, 1994

[51] Int. Cl.$^6$ ................................ G21G 5/00; A61N 5/00
[52] U.S. Cl. .......................................................... 250/492.1
[58] Field of Search ............................ 250/492.1; 378/64

[56] References Cited

U.S. PATENT DOCUMENTS

| | | | |
|---|---|---|---|
| 3,616,357 | 10/1971 | Haynes | 204/157.1 H |
| 4,749,869 | 6/1988 | Fournier | 250/492.1 |
| 5,084,909 | 1/1992 | Pollak | 378/64 |

*Primary Examiner*—Bruce C. Anderson
*Attorney, Agent, or Firm*—Ostrolenk, Faber, Gerb & Soffen

[57] ABSTRACT

Gemstone quality topaz is produced by a procedure which involves irradiating the topaz with fast neutrons at elevated temperature to an exposure level of at least about $10^{17}$ cm$^{-2}$ followed by irradiation with electrons or gamma rays.

10 Claims, No Drawings

METHOD OF PRODUCING GEMSTONE QUALITY TOPAZ

BACKGROUND OF THE INVENTION

Topaz is a naturally occurring aluminum fluorosilicate [$Al_2SiO_4F_2(OH)$] which has an orthorombic crystalline structure. The native topaz as mined can be in a variety of colors including the so-called "imperial" topaz and a variety of light blue colors. The vast majority of the natural topaz, however, is colorless and has no commercial value as a semi-precious gemstone.

It has been known for a considerable amount of time that irradiation of gemstones with a variety of types of radiation, including gamma rays, neutrons or high energy electrons, can cause an alteration in the color of the stone. In most cases, however, the colors that result from the radiation treatment are unstable and tend to fade upon exposure to sunlight or even over extended periods in a dark environment.

About 20 years ago, it was noted that gamma irradiation of topaz produced a stable blue color in a fraction of the stones so treated. In a small percentage of the limited number of stones which developed color, a highly desirable pure blue color could be produced. However, the majority of the stones which were colored in this manner contained a gray component which reduced their value relative to pure colors. Subsequently it was discovered that irradiation with high energy electrons produced a more desirable color, albeit one which tended to be quite pale, and which is generally referred to in the trade as "sky blue" in a fraction of the topaz stones. The amount of energy utilized in the high energy electron process was a function of two considerations, namely that energies of less than about 5 MeV meant the penetration depth of the beam into the stones was quite limited and therefore only small stones were processable and above about 18 MeV, radioactivity was induced in the stone. The optimum dose was found to be between a few hundred and 10,000 Megarad. In both the gamma irradiation and high energy electron irradiation processes, large amounts of uncolored stones remained. The one-step gamma ray or electron processes suffer from the fact that the resulting blue product is uneven with the intensity of the final color varying from none at all to, occasionally, comparable to a "super blue" color. The electron treatment alone is especially non-economical because the stones must be essentially cut to the final size prior to treatment in order to maximize the beam penetration and minimize the cracking associated with the end of range effects in the electron beam.

In approximately 1980, it was reported that irradiation with neutrons produced a consistent blue color although most of the resulting material was found to be radioactive, with radiation levels above those acceptable in commerce. The color which resulted from neutron radiation was darker and typically contained a significant amount of gray compared to the sky blue colors which had been produced by electron irradiation. Subsequent research demonstrated that the radioactivity could be reduced by shielding the irradiation container in such a way as to eliminate the thermal neutrons which were responsible for much of the activation. The color was thus produced by the fast neutrons, that is those having an energy of greater than about 1 MeV, but there remained a degree of radioactivity induced by these fast neutrons and also by the thermalization of the fast neutrons within the irradiation volume. It was also noted that the quality of the topaz varied depending on its geographic origin and that also influenced the radioactivity of the resulting product. The color which was produced by such neutron irradiation is generally referred to in the trade as "London blue". The neutron process alone produces a consistent product but the color is less pure than that produced by electrons and is therefore generally believed to be less desirable.

The neutron irradiation process came to be widely used to treat topaz which had already been treated by the electron irradiation process but had not been colored. This was an effort to recover the economic value of the effort associated with the cutting and polishing of the stone. Eventually non-irradiated material was also treated by this method.

At about this time, Joe Bordon and Charles Key found that neutron irradiation to produce a strong blue color followed by electron irradiation produced a superior color, free from the gray characteristic of the neutron irradiation and more intense than that produced by electron irradiation alone. However they abandoned this process because of the radioactivity which was produced in the neutron irradiation step. In 1984, George Drake published a prospectus entitled "Possibilities for Color Enhancement of Gem Materials by Treatment with Ionizing Radiation, Heat Chemicals &c." in which he discussed the use of gamma irradiation as a pre-screening technique for selecting topaz suitable for electron irradiation, in order to increase the yield from the electron process. In addition, Drake reported that the electron irradiation of gamma treated material led to a reduction in the gray color and an improvement in the quality of the final product. In 1985, Nassau (Altering the Color of Topaz, Gems and Gemology, Spring 1985, P26– 34) discussed the three forms of radiation and consistently compared the gray color produced by either neutrons or gamma rays to the finer color produced from electrons. Also around 1986, the Bordon and Key process was rediscovered by several investigators who incorporated the improvements which had been developed for the one step neutron irradiation process in order to minimize the radioactivity and yield a commercially acceptable product. At approximately the same point in time, the United States Nuclear Regulatory Commission also developed a set of standards under which reactor irradiated topaz could be released to the market as "exempt" material. The color which is produced by the two-step neutron irradiation/electron irradiation process is referred to by many names including "super" "maxi" "American" and "Californian" blue. For consistency purposes only, this color will be referred to hereinafter as "super blue". The work of Drake confirms that this color may be produced by a two step gamma/electron process, and it is has been claimed that starting material may be identified to give a high yield from this process. Thus, the production of a "super blue" color does not require the two step neutron/electron (gamma) process.

Subsequently, a process was developed in which the electron irradiation step was replaced by irradiation with high energy gamma rays produced in a secondary process by sending the electron beam into a heavy metal target which converted much of the electron energy into gamma rays. Because of the high penetration of the gamma rays into the gemstone and the limited energy deposition, this process can be used on much larger stones than those treated with electrons. Unfortunately, the substitution of gamma rays for electrons also introduced a high cost to the process because of the inefficiency associated with conversion of electrons into gamma rays. In general, this substitution is only of value in treating very large stones which otherwise would not have been treated.

Two views of the history of irradiated topaz are presented in two U.S. patents. These are the patent to Fournier, U.S. Pat. No. 4,749,869 which issued in 1988 and Pollak, U.S. Pat. No. 5,084,909 which issued in 1992.

The dual neutron/electron process described by Fournier has a number of drawbacks. An essential requirement of this process is that the neutron irradiation be carried out sufficiently to produce at least some blue color in the stone. The color induced in the topaz gemstones by neutron irradiation depends upon two factors: the total neutron dose and the temperature of the stones during the irradiation process. If the radiation dose rate is low or if intensive cooling is provided so that the temperature is low (less than about 200° C.), then any blue color which has developed is masked by other colors. In that event, a heat treatment is required in order to remove those other colors and reveal whether a sufficient blue component is present (which signifies that the next step can be carried out). Alternatively, if the radiation dose rate is high and the cooling is not adequate such that the temperature of the stones is high during the irradiation (about 300° C.), then the blue color which is developing is removed or substantially reduced. As a result, the irradiation conditions and cooling must be carefully controlled. This, in turn, leads to the requirement for irradiating at a distance sufficiently removed from the irradiation source so that the nuclear heating is limited or the addition of satisfactory cooling systems in order to limit the temperature in the irradiation box to the appropriate extent. The need to maintain a lower irradiation temperature limits how close the irradiation box can be placed to the reactor core and that, also in turn, reduces the available fast neutron flux for the production of the desired result. Stones which have been inadvertently overheated during the neutron treatment such that little or no color is produced have routinely been re-irradiated (to the extent permitted by the induced radioactivity) to yield the recommended blue-gray color.

In order to produce a strong color in small stones, it is necessary to perform very long neutron irradiations, which, in turn, leads to very strong gray shades in these stones prior to electron irradiation. As a result, the electron treatment, even in excess of 10,000 MRad, may not be sufficient to remove the gray color.

Additionally, neutron irradiated stones are more susceptible to cracking in an electron beam than non-irradiated stones. This is a result of radiation damage, and means that control of the electron beam energy and scanning parameters are more critical than for non-irradiated material. In addition, many thick stones, which would not break if irradiated with electrons alone, will break or crack if treated with neutrons and electrons according to the prior process.

It will be appreciated from the foregoing discussion that there still remains a considerable amount of improvement which can be imparted into the processes for producing gemstone quality topaz. It is accordingly the object of this invention to provide such an improved process. This and other objects of the invention will become apparent from the following detailed description.

SUMMARY OF THE INVENTION

This invention relates to a method of producing gemstone quality topaz and more particularly relates to a process in which the topaz is irradiated with fast neutrons to an exposure level of at least about $10^7$ cm$^{-2}$ at an elevated temperature and is thereafter irradiated with electrons or gamma rays. The neutron doses required for the production of the same final color intensity are typically 10–20% larger than in the prior art.

DETAILED DESCRIPTION OF THE INVENTION

The current art relies on the production of some blue color by means of the neutron irradiation and the subsequent modification of that color by means of an electron or gamma irradiation step. The blue color induced by the neutron irradiation may be perceptible or may be masked by the presence of other colors if the irradiation is performed at a temperature below about 250° C. but is required. However, results of the gamma or electron irradiation alone have shown that in some cases stones can develop the "super blue" color from a colorless state. It has been determined that irradiation with neutrons at high temperature can produce a proper state which, while colorless, is such that the "super blue" color is consistently produced without the dual steps of production and modification of a blue-gray color. The high temperature process converts the stone into a state which is different than that created by the Fournier process, as shown by the absence of color and by the reduced susceptibility to cracking during the subsequent electron irradiation step.

The methods in the prior art which require that a blue color be produced to some extent by the neutron irradiation has significant implications to the process parameters. Since the temperature in that process must be kept below about 300° C., the irradiation box must be located at a place which is distant from the reactor core or cooling must be provided if the box comes close to the reactor core where the heating is substantial. Even when forced cooling is provided, it may not be possible to approach the place at which the fast neutron flux is at its highest and where the production rate would be the greatest. There is clearly a significant economic advantage to move the irradiation box as close to the reactor core as is possible, which possibility was not believed feasible in the prior art. Furthermore, the cooling systems in use at various neutron irradiation centers because of the high temperatures which exist are costly to install and maintain. Their simplification or elimination would reduce the cost of treating the topaz.

The invention essentially avoids these limitations and reduces the cost of the equipment while potentially increasing the rate of productivity. Additionally, the higher irradiation temperature employed anneals some of the defects in the topaz which are responsible for the fragility of the gemstones when they are subsequently placed in the electron beam while inducing in the stones a colorless state suitable for the direct production of the "super blue" color by a subsequent electron (or gamma) irradiation step. Table 1 gives the results of cracking tests on a set of initially identical stones. Row 1 gives the irradiation and temperature conditions, row 2 gives the percent of cracked stones for each condition using stones 13 mm thick. The neutron doses were identical in conditions 2 and 3. It is clear that the high temperature reduces the cracking significantly.

TABLE 1

| Percent of Stones Cracked For Different Irradiation and Temperature Conditions | | |
| --- | --- | --- |
| Condition: | E | N + E (250° C.) | N + E (500° C.) |
| % Breakage: | 0% | 70% | 15% |

E: electrons 10 MeV, 10,000 MRad
N: both lots subjected to the same neutron doses and dose rate.

The higher temperature also makes the control of that electron beam less critical and thicker stones can be treated or deeper irradiation containers can be placed in the beam, further leading to an enhanced production rate and yield.

The present invention, while employing a two step neutron/irradiation process which is superficially similar to the prior art processes, is distinguished by the direct production of the "super blue" color by electrons from colorless stones rather than through the creation and then modification of a blue-gray color. In contrast to the low temperature prior art processes, the invention uses high temperature during neutron irradiation, which yields colorless stones with reduced radiation damage and in the appropriate starting state for the direct production of "super blue" topaz. The higher temperature and improved annealing may also allow for a higher neutron dose rate and consequently a higher production rate. The neutron irradiation can otherwise be carried out in a similar manner as previously, that is in a container with shielding material such as $B_4C$ sufficiently thick to block out the thermal neutrons and a large percentage of the epithermal neutrons. However, in the process of the invention, the degree of cooling may be reduced or eliminated and the container may be moved closer to the reactor core.

In the invention, the topaz is neutron irradiated with a dose which is determined by the intensity of the desired color and the size of the stone. In general, the dose is inversely proportional to the size of the stone. For instance, a very small stone of say 3 mm will receive the largest dose while a stone which is twice as thick will require roughly half as many neutrons to achieve the same color. The dose is generally at least about $10^{-7}$ fast neutrons per $cm^2$ and preferably between about $10^{-7}$ and $5 \times 10^8$ fast neutrons per $cm^2$.

The irradiation is carried out at a temperature of at least about 350° C. which produces no color in the topaz. If the temperature of the neutron irradiation is too great, the stones may crack in the neutron processing or the neutron-induced color producing defects will begin to anneal. Accordingly, the irradiation temperature generally does not exceed about 600° C. The preferred temperature range is about 400° to 500° C. Because no color is produced in this step, it is necessary to monitor the neutron dose in another manner. There are several well known techniques for doing so and any of these can be utilized. The monitoring method presently preferred is the conventional nickel flux wire technique.

The second step of the process is the conventional electron or gamma ray irradiation. Any of the procedures known in the prior art can be employed. For instance, when the neutron irradiated topaz is irradiated with electrons, the exposure level will generally be in the range of about 1000 to 10,000 megarads. In the case of irradiation with gamma rays, the total exposure is generally between about 200 and 10,000 megarads. In the prior art, a heating step between the neutron irradiation and the electron or gamma ray radiation steps was sometimes employed in an effort to eliminate greenish or grayish colors. Because of the higher temperatures which are tolerated in the neutron irradiation step of the invention, this may not be necessary but it can be utilized if so desired.

The preferred embodiment of the invention will optimize the yield of high quality stones by minimizing the required neutron dose, maximizing the neutron dose rate and minimizing the number of stones cracked in the subsequent electron irradiation. The specific process parameters depend upon the size of the stones and to some extent their origin (which has been found to influence the amount of gray in the prior methods). As an example, for 3 mm diameter round stones from Sri Lanka, neutron irradiation at 400° C. to $4 \times 10^{18}$ n/cm$^{-2}$ (fast neutrons) followed by a 10,000 MRad 10 MeV electron irradiation yields excellent results. For similar stones from Nigeria, this treatment leaves residual gray but increasing the temperature to 450° C. and the dose to $5 \times 10^{18}$ leads to results similar to the Sri Lanka case. In neither case is cracking a significant problem during the electron treatment. For large stones, e.g. 22×18 mm oval, a dose of $5 \times 10^{17}$ is sufficient, but temperatures of 500°–525° C. are required to minimize the cracking during the electron irradiation step. In all cases, excellent "super blue" colors result.

Various changes and modifications can be made in the process of this invention without departing from the spirit and scope thereof. The various embodiments which were described herein were for the purpose of illustrating the process and were not intended to limit the invention.

What is claimed is:

1. In a method of producing a blue colored topaz by irradiating the topaz in a fast neutron environment and thereafter irradiating the neutron treated topaz with electrons or gamma rays, the improvement which comprises irradiating the topaz in the fast neutron environment at elevated temperature to an exposure level of at least about $10^{17}$ cm$^{-2}$ to thereby produce a neutron irradiated topaz which does not exhibit a blue coloration and then subjecting the colorless neutron treated topaz to the electron or gamma ray irradiation.

2. The method of claim 1 in which the neutron exposure level is up to about $5 \times 10^{18}$ cm$^{-2}$.

3. The method of claim 1 in which the neutron irradiation temperature is at least about 350° C.

4. The method of claim 3 in which the temperature is up to about 600° C.

5. The method of claim 4 in which the temperature is about 400° to 500° C.

6. The method of claim 5 in which the exposure level is up to about $5 \times 10^{18}$ cm$^{-2}$.

7. The method of claim 6 in which electron irradiation is employed after the neutron irradiation.

8. The method of claim 6 in which gamma ray irradiation is employed after the neutron irradiation.

9. The method of claim 1 in which electron irradiation is employed.

10. The method of claim 1 in which gamma ray irradiation is employed.

* * * * *